United States Patent
Mizuguchi et al.

(10) Patent No.: US 7,173,300 B2
(45) Date of Patent: Feb. 6, 2007

(54) MAGNETORESISTIVE ELEMENT, METHOD FOR MAKING THE SAME, AND MAGNETIC MEMORY DEVICE INCORPORATING THE SAME

(75) Inventors: Tetsuya Mizuguchi, Kanagawa (JP); Kazuhiro Bessho, Kanagawa (JP)

(73) Assignee: Sony Corporation, Tokyo (JP)

( * ) Notice: Subject to any disclaimer, the term of this patent is extended or adjusted under 35 U.S.C. 154(b) by 402 days.

(21) Appl. No.: 10/328,118

(22) Filed: Dec. 23, 2002

(65) Prior Publication Data

US 2003/0123197 A1 Jul. 3, 2003

(30) Foreign Application Priority Data

Dec. 27, 2001 (JP) ............... P2001-396212

(51) Int. Cl.
*H01L 29/76* (2006.01)
(52) U.S. Cl. ............... 257/295; 257/295; 257/296
(58) Field of Classification Search ........ 257/295, 257/296; 360/324; 365/173
See application file for complete search history.

(56) References Cited

U.S. PATENT DOCUMENTS

| | | | | |
|---|---|---|---|---|
| 6,166,948 A * | 12/2000 | Parkin et al. | ............... | 365/173 |
| 6,567,246 B1 * | 5/2003 | Sakakima et al. | ..... | 360/324.11 |
| 6,600,184 B1 * | 7/2003 | Gill | ............... | 257/295 |
| 6,788,502 B1 * | 9/2004 | Gill | ............... | 360/324.2 |

* cited by examiner

*Primary Examiner*—Andy Huynh
*Assistant Examiner*—Thinh T Nguyen
(74) *Attorney, Agent, or Firm*—Sonnenschein Nath & Rosenthal LLP

(57) ABSTRACT

A magnetoresistive element including a free layer having rotatable magnetization, in which information is recorded in the magnetoresistive element by the rotation of the magnetization of the free layer, is provided. The free layer is a laminate that includes at least one ferromagnetic sublayer composed of a ferromagnetic material and at least one low-saturation-magnetization ferromagnetic sublayer having a lower saturation magnetization than that of the ferromagnetic sublayer.

6 Claims, 3 Drawing Sheets

MAGNETORESISTIVE ELEMENT, METHOD FOR MAKING THE SAME, AND MAGNETIC MEMORY DEVICE INCORPORATING THE SAME

BACKGROUND OF THE INVENTION

1. Field of the Invention

The present invention relates to a magnetoresistive element, i.e., an element that changes its resistance according to an applied external magnetic field (magnetoresistive effect), and to a method for making the same. The present invention is also directed to a magnetic memory device including the magnetoresistive element.

2. Description of the Related Art

Recently, magnetic random access memories (MRAMs) have drawn much attention among the magnetic memories that function as memory devices. Magnetic random access memories use magnetoresistive elements of a giant magnetoresistive (GMR) type or a tunneling magnetoresistive (TMR) type and store information using the magnetization rotation of the magnetoresistive elements.

For example, a TMR element of an MRAM includes a free layer composed of a ferromagnetic material, a nonmagnetic intermediate layer composed of an insulator, a pinned layer composed of a ferromagnetic material, and an antiferromagnetic layer for directly or indirectly pinning the magnetization direction of the pinned layer. These layers are stacked in that order so that the resistance of the tunneling current can change according to the magnetization direction of the free layer. In the MRAM, "1" is recorded when the magnetization of the free layer is oriented in a particular direction, and "0" is recorded when the magnetization of the free layer is oriented in the opposite direction. In reading the information recorded in the MRAM, the magnetization direction of the free layer is detected as the voltage signal generated by the change in resistance of the tunneling current.

Magnetoresistive elements of MRAMs are becoming increasingly smaller to increase the degree of integration. Naturally, free layers having rotatable magnetization where switching operation is performed are also becoming smaller. However, in small free layers, the distance between two ends of the free layers, i.e., the distance between magnetic poles of the free layers, is also small, resulting in an increase in demagnetizing field in the free layer. Since the demagnetizing field decreases the intensity of the external magnetic field applied to the free layer, the coercive force of the free layer is significantly increased, and the magnetization of the free layer can no longer rotate to perform switching operation unless a larger magnetic field is applied to the free layer. In other words, with an increased demagnetizing field, the current supplied to the electrode layer for rotating the magnetization direction of the free layer must also be increased. As a result, the energy consumption required for writing information increases.

One way of preventing an increase in coercive force due to the demagnetizing field is to decrease the moment of the free layer to make the demagnetizing field less dependent from the size of the element. Here, the moment is the product of the saturation magnetization Ms of the ferromagnetic material constituting the free layer and the thickness of the free layer. This is possible because the relationship $Hd = A \times Ms \times t/W$ is established among the demagnetizing field Hd, the moment $Ms \times t$, and the length W of the element in the direction of application of the magnetic field (usually the easy-axis direction). Changing the ferromagnetic material constituting the free layer is difficult since such a change significantly affects the magnetoresistance (MR) ratio; thus, the moment of the free layer must be decreased by reducing the thickness of the free layer.

However, at an excessively small thickness, e.g., a thickness of approximately 1 to 2 nm, the free layer may not be formed as one continuous layer or may suffer from degraded heat stability. An increase in coercive field due to the demagnetization cannot sufficiently be prevented by merely reducing the thickness of the free layer.

FIG. 6 is a graph showing the dependency of the saturation magnetization of a NiFe layer on the layer thickness in a composite prepared by stacking a tantalum (Ta) layer, a nickel-iron (NiFe) layer, and another tantalum (Ta) layer. As is apparent from the graph, the saturation magnetization of the NiFe layer decreases dramatically below a certain thickness, e.g., approximately 2 nm. This is because a free layer having an excessively small thickness has, for example, an island structure, no longer forms a continuous layer, and suffers from thermal diffusion from adjacent layers. Although a decrease in the saturation magnetization can contribute to making a free layer having a low moment, the moment significantly varies according to minute changes in the layer thickness within the range of approximately 1 nm, resulting in poor reproducibility and large variation. This also poses a limit to thickness reduction of the free layer.

SUMMARY OF THE INVENTION

An object of the present invention is to prevent an increase in coercive force of the free layer without problems arising from the thickness reduction of the free layer and to provide a magnetoresistive element that requires less power during writing. A method for making the magnetoresistive element and a magnetic memory device using the magnetoresistive element are also provided.

A magnetoresistive element according to an aspect of the present invention includes a free layer having rotatable magnetization, in which information is recorded in the magnetoresistive element by the rotation of the magnetization of the free layer. The free layer is of a multilayer structure and includes at least one ferromagnetic sublayer composed of a ferromagnetic material and at least one low-saturation-magnetization ferromagnetic sublayer having a lower saturation magnetization than that of the ferromagnetic sublayer.

Another aspect of the present invention provides a method for making a magnetoresistive element including a free layer having rotatable magnetization in which information is recorded in the magnetoresistive element by the rotation of the magnetization of the free layer. The method includes a process of making the free layer, and the process includes the steps of depositing a ferromagnetic sublayer composed of a ferromagnetic material and depositing a low-saturation-magnetization ferromagnetic sublayer having a lower saturation magnetization than the ferromagnetic layer.

Another aspect of the present invention provides a magnetic memory device including a magnetoresistive element including a free layer having a rotatable magnetization in which information is recorded in the magnetoresistive element by the rotation of the magnetization of the free layer. The free layer includes at least one ferromagnetic sublayer comprising a ferromagnetic material and at least one low-saturation-magnetization ferromagnetic sublayer having a lower saturation magnetization than that of the ferromagnetic sublayer.

In the magnetoresistive element having the above-described features, a magnetoresistive element made by the above-described method, and the magnetic memory device having the above-described features, the thickness of the layer which substantially affects the saturation magnetization of the free layer, i.e., the thickness of the ferromagnetic sublayer, is small. Thus, compared to a free layer that has a single layer structure including only a ferromagnetic layer, an increase in coercive force can be prevented. Moreover, since the low-saturation-magnetization ferromagnetic sublayer helps form a continuous ferromagnetic sublayer, problems arising from thickness reduction of the free layer can be avoided.

DESCRIPTION OF THE PREFERRED EMBODIMENTS

A magnetoresistive element, a method for making the magnetoresistive element, and a magnetic memory device using the magnetoresistive element according to the present invention will now be described with reference to the drawings. In the following embodiment, the magnetoresistive element is of a tunneling magnetoresistive (TMR) type, hereinafter referred to as a "TMR element", and the magnetic memory device is a magnetic random access memory (MRAM) incorporating the TMR element.

Structure of Magnetic Memory Device

Figure 1:
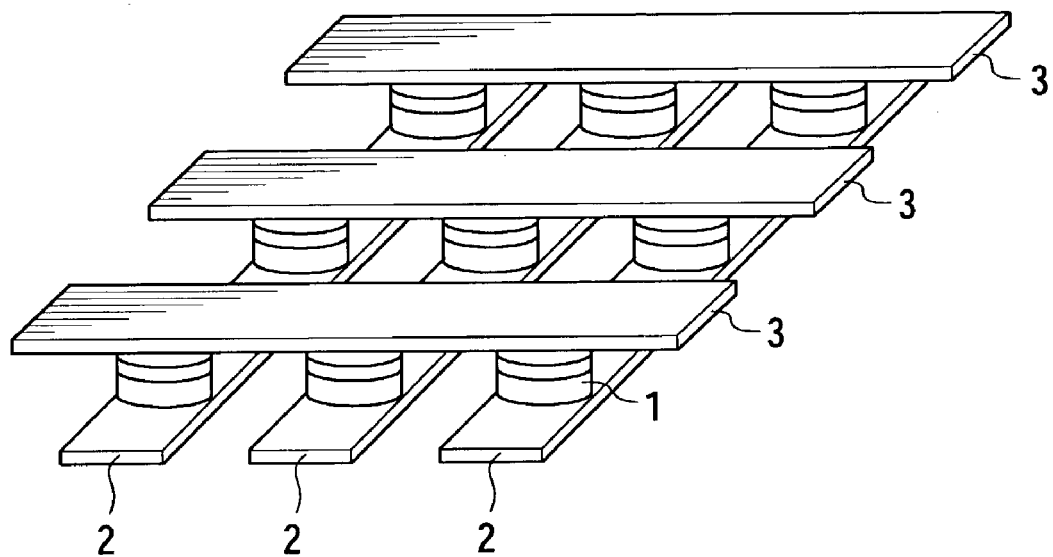
FIG. 1 is a perspective view of a basic structure of a MRAM.

The overall structure of a magnetic memory device according to an embodiment of the present invention will now be described. FIG. 1 is a perspective view of a basic structure of a MRAM. The MRAM includes a plurality of TMR elements 1 arranged in a matrix. Word lines 2 are arranged in a transverse direction on the rows of the TMR elements 1. Bit lines 3 are arranged in a longitudinal direction under the columns of the TMR elements 1. Each of the TMR elements is disposed at the intersection of the word line 2 and the bit line 3 and is thus sandwiched by the corresponding word line 2 and the bit line 3. The word lines 2 and the bit lines 3 are formed by a known process, e.g., by depositing a conductive material such as aluminum, copper, or an alloy thereof by a chemical or physical process and selectively etching the deposited layer.

Figure 2:
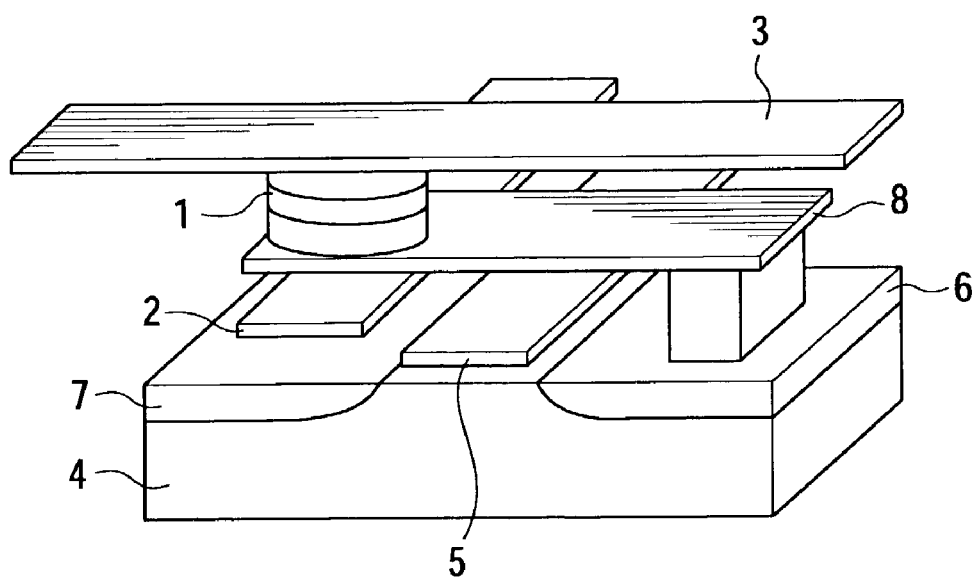
FIG. 2 is a perspective view showing the structure near each TMR element of the MRAM.

FIG. 2 is a perspective view showing the structure near each TMR element 1 of the MRAM. A field effect transistor having a gate electrode 5, a source region 6, and a drain region 7 is formed on a semiconductor substrate 4. The word line 2, the TMR element 1, and the bit line 3 are disposed above the field effect transistor. The TMR element 1 sandwiched between the word line 2 and the bit line 3 is connected to the field effect transistor via a bypass line 8.

In the MRAM having the above-described structure, an electric current is supplied to both the word line 2 and the bit line 3 to generate a magnetic field, and the information is written on the TMR element 1 by the rotation of the magnetization direction of the free layer using the resultant magnetic field. In reading information written in TMR elements, a TMR element 1 is selected using a field effect transistor among the TMR elements 1, and the magnetization direction of the free layer in the selected TMR element is detected as a voltage signal.

Structure of Magnetoresistive Element

Next, the structure of each TMR element 1 used in the MRAM is described. The TMR 1 has a magnetic tunnel junction (MTJ) structure in which a free layer composed of a ferromagnetic material, a nonmagnetic intermediate layer composed of an insulator, a pinned layer composed of a ferromagnetic material, and an antiferromagnetic layer for directly or indirectly pinning the magnetization direction of the pinned layer are stacked in that order. Information is written in the TMR element 1 by the magnetization rotation of the free layer, and the resistance of the tunneling current changes with the direction of the magnetization.

Figure 3:
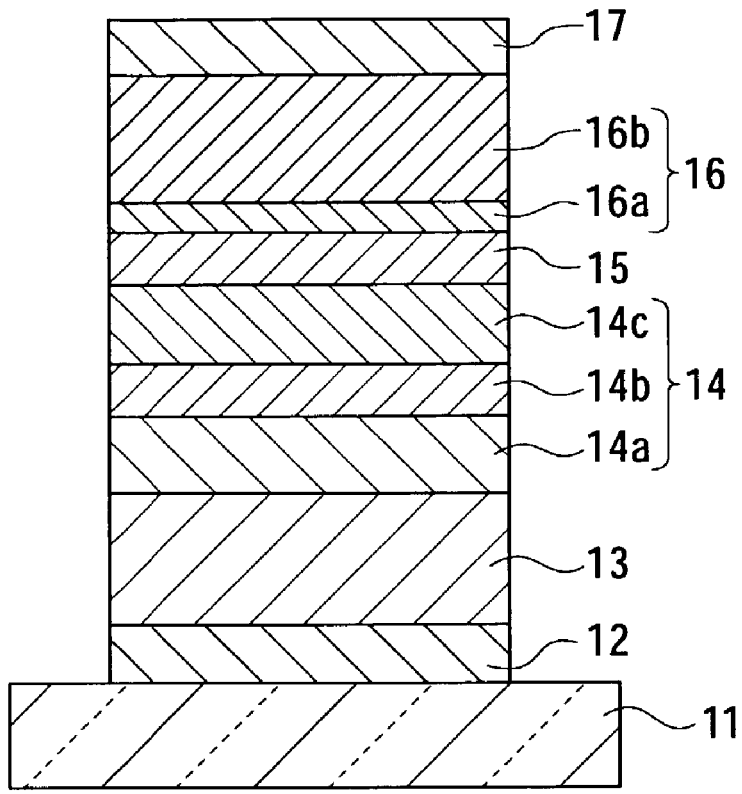
FIG. 3 is a sectional side elevation showing an example multilayer structure of a TMR element having a magnetic tunnel junction structure.

FIG. 3 is a sectional side elevation showing an example structure of the TMR element 1. As shown in FIG. 3, the TMR 1 is prepared by stacking a tantalum (Ta) layer 12 having a thickness of 3 nm, a platinum-manganese (PtMn) layer 13 having a thickness of 30 nm, a cobalt-iron (CoFe) layer 14a having a thickness of 1.5 nm, a ruthenium (Ru) layer 14b having a thickness of 0.8 nm, a cobalt-iron (CoFe) layer 14c having a thickness of 2 nm, an aluminum oxide ($AlO_x$) layer 15 having a thickness of 1 nm, a nickel iron (NiFe) layer 16a having a thickness of 2 nm, a NiFeRu layer 16b having a thickness of 2 nm, and a tantalum (Ta) layer 17 having a thickness of 5 nm. These layers are stacked on a substrate 11. The thicknesses of these layers are not limited to the above-described thicknesses.

The Ta layer 12 functions as an underlayer and the PtMn layer 13 functions as an antiferromagnetic layer. The nonmagnetic Ru layer 14b and the CoFe layers 14a and 14c constitute a ferrimagnetic laminate 14 which functions as a pinned layer. The aluminum oxide layer 15 functions as an intermediate layer, and the Ta layer 17 functions as a protective layer.

In this TMR element 1, a laminate 16 constituted from the NiFe layer 16a and the NiFeRu layer 16b functions as a free layer having a rotatable magnetization. In other words, the free layer of the TMR element 1 has a multilayer structure comprising two layers, namely, the NiFe layer 16a and the NiFeRu layer 16b.

The NiFeRu layer 16b has a smaller saturation magnetization than that of the NiFe layer 16a since the NiFeRu layer 16b contains Ru in addition to the ferromagnetic material, NiFe.

The NiFe layer 16a is arranged to be in contact with the aluminum oxide layer 15 which functions as the intermediate layer. This is because the NiFe layer 16a is composed of NiFe having a high spin polarization and produces a higher MR effect than the NiFeRu layer 16b. In other words, since the portion in contact with the intermediate layer significantly affects the MR characteristic of the TMR element 1, the NiFe layer 16a composed of a material that can produce a high MR effect is arranged to be in contact with the intermediate layer.

Method for making Magnetoresistive Element

A method for making the above-described TMR element 1 will now be described.

The TMR element 1 is made using, for example, a magnetron sputtering device the backpressure of which is adjusted to an ultra-high vacuum. With the magnetron sputtering device, the Ta layer 12, the PtMn layer 13, the CoFe layer 14a, the Ru layer 14b, the CoFe layer 14c, and an aluminum layer are deposited in that order on the substrate 11. Subsequently, the aluminum layer is oxidized under high pressure or in plasma so as to allow oxidation to progress from the top face and to obtain a homogeneous $AlO_x$ layer 15. Also using the magnetron sputtering device, for example, the NiFe layer 16a, the NiFeRu layer 16b, and the Ta layer 17 are deposited in that order on the $AlO_x$ layer 15. If necessary, the resulting composite may be heated to allow the PtMn layer 13 to have an ordered-alloy structure.

As described above, the method for making the TMR element 1 according to this embodiment includes the process of making a free layer including the steps of depositing the NiFe layer 16a composed of a ferromagnetic material and depositing the NiFeRu layer 16b having a smaller saturation magnetization than that of the NiFe layer 16a.

In the step of depositing the NiFeRu layer 16b, NiFe and Ru are simultaneously sputtering to deposit the NiFeRu layer 16b, for example. The sputtering rate of Ru is adjusted to control the amount of ruthenium added to NiFe. By controlling the sputtering rate, the resulting NiFeRu layer 16b can have zero saturation magnetization (nonmagnetic) or a predetermined saturation magnetization.

In the step of depositing the NiFe layer 16a, only NiFe is sputtered to deposit the NiFe layer 16a. Since the free layer of this embodiment is formed as a laminate of the NiFe layer 16a and the NiFeRu layer 16b, the thickness of the ferromagnetic layer, i.e., NiFe layer 16a, can be decreased compared with that of a known free layer having a single-layer structure constituted from only a ferromagnetic layer composed of, for example, NiFe. To be specific, the thickness of the NiFe layer 16a is 2 nm when the thickness of the laminate of the free layer is 4 nm.

Characteristics of Magnetoresistive Element

Figure 4:
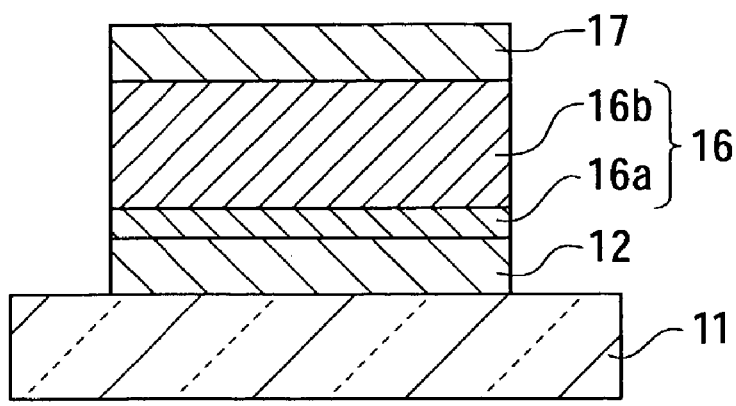
FIG. 4 is a sectional side elevation showing an example of a laminate for examining the characteristics of the TMR element 1.
Figure 5:
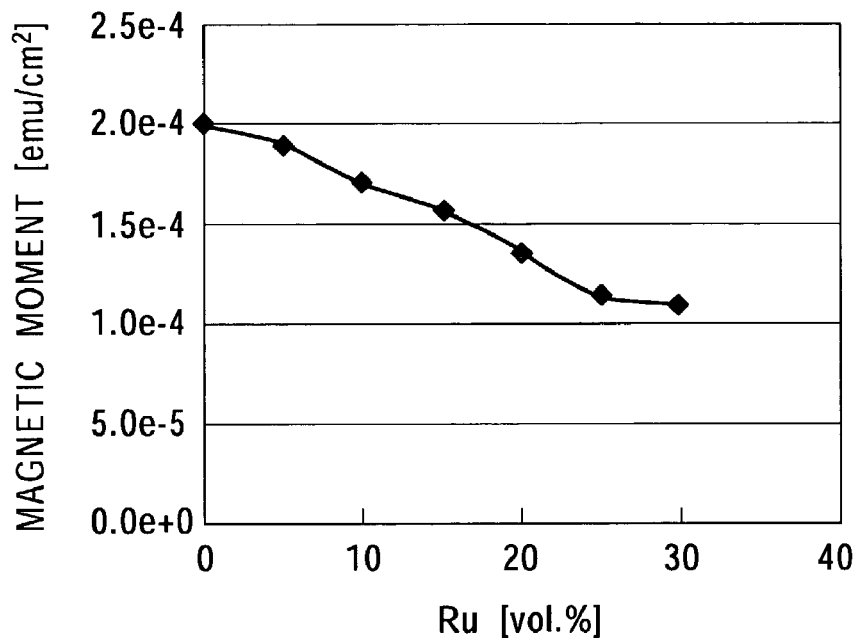
FIG. 5 is a graph showing the magnetic characteristic of the laminate.

The characteristics of the TMR element 1 made by a method including the above-described deposition processes will now be described. In explaining the characteristics of the TMR element 1, the magnetic characteristics of a laminate having a structure identical to that of the free layer of the TMR element 1 are examined. FIG. 4 is a sectional side elevation showing an example of a laminate for examining the characteristics of the TMR element 1. FIG. 5 is a graph showing the magnetic characteristic of the laminate.

Referring to FIG. 4, the laminate includes the substrate 11, the Ta layer 12 (3 nm in thickness), the NiFe layer 16a (2 nm in thickness), the NiFeRu layer 16b (2 nm in thickness), and the Ta layer 17 (5 nm in thickness) stacked in that order. The amount of ruthenium in the NiFeRu layer 16b is controlled by adjusting the sputtering rate of ruthenium.

The magnetic moment per unit area of the laminate was examined. The results are shown in FIG. 5. FIG. 5 demonstrates that the magnetic moment is dependent on the amount of additive ruthenium.

Figure 6:
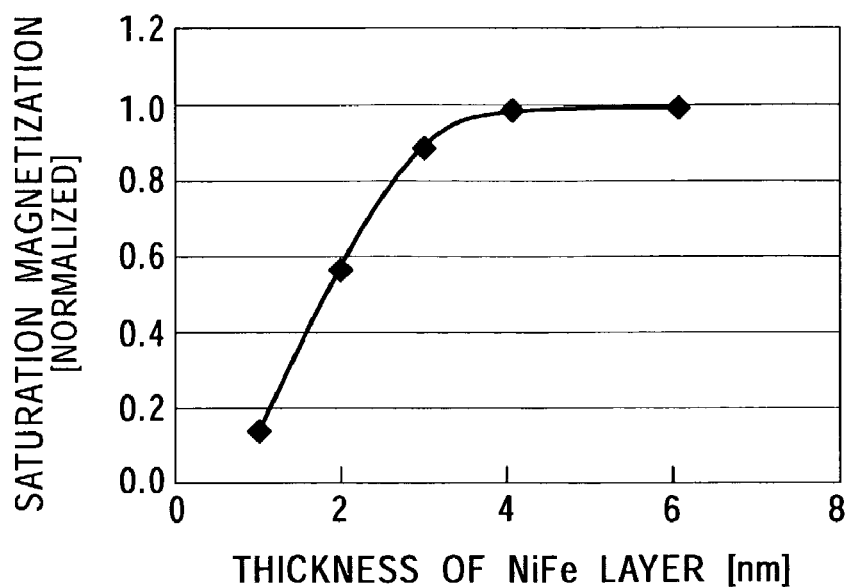
FIG. 6 is a graph showing the dependency of the saturation magnetization of a laminate used in a known TMR element on the layer thickness.

In particular, according to the graph in FIG. 5, the magnetic moment of the NiFeRu layer 16b decreases as the amount of ruthenium added to NiFe increases, resulting in a decrease in magnetic moment of the entire laminate. At a Ru content exceeding approximately 25%, a decrease in the magnetic moment is inhibited and the magnetic moment remains substantially constant. This is presumably because the magnetic moment of the NiFeRu layer 16b vanishes as the Ru content increases, and only the magnetic moment of the NiFe layer 16a is working in the laminate. This presumption is also supported by the graph shown in FIG. 6. The magnetic moment after the Ru content has reached approximately 25% in FIG. 5 is about half the magnetic moment of a known single-layer-structure NiFe layer having a thickness of 4 nm, as shown in FIG. 6. In other words, the magnetic moment of the laminate is substantially the same as the magnetic moment of a NiFe layer having a thickness of 2 nm.

Whereas a conventional free layer has had the saturation magnetization drastically decreased at a Ru content of approximately 25% or less at a thickness of a NiFe layer of approximately 2 nm or less, as shown in FIG. 6, the magnetic moment of the free layer of the invention is on the increase at such a Ru content and a thickness. This demonstrates that a layer having a high spin polarization that sufficiently functions even when a NiFe layer composed of a material having a high spin polarization is thin is formed. According to this structure, since the NiFeRu layer 16b adjacent to the NiFe layer 16a is not completely nonmagnetic, thermal diffusion to the NiFe layer 16a, i.e., the high spin polarization layer, is reduced. In other words, the thermal diffusion from the Ta layer 17 to the NiFe layer 16a is controlled by the NiFeRu layer 16b. Moreover, since the NiFeRu layer 16b contains nickel and iron, the NiFe layer 16a can readily be formed as one continuous layer.

In view of the above, the magnetic moment of the layer having the above-described multilayer structure can be suitably controlled by adjusting the amount of Ru in the NiFeRu layer 16b. Thus, the magnetic moment of the TMR element having the same multilayer structure can be suitably adjusted without reducing the thickness of the free layer, i.e., without decreasing the volume of portion functioning as a free layer. Thus, an increase in coercive force of the free layer can be regulated.

The free layer of the TMR element 1 of the present invention is constituted from the NiFe layer 16a composed of a material having a high spin polarization and the NiFeRu layer 16b having a smaller saturation magnetization than that of the NiFe layer 16a. With such a structure, the coercive force of the free layer as a whole can be decreased since the thickness of the layer that affects the saturation magnetization of the free layer, i.e., the NiFe layer 16a, can be decreased. Moreover, the NiFe layer 16a can be formed as one continuous layer due to the presence of the NiFeRu layer 16b, thereby overcoming the problem previously encountered in related art.

In a MRAM incorporating the TMR element 1 of the present invention, the coercive force of the free layer can be decreased without suffering from problems previously encountered when the thickness of the free layer is reduced. Thus, the power consumption during writing can be decreased, and the degree of integrity of the MRAM can easily be increased.

The magnetic moment of the free layer of the TMR element 1 can be controlled by adjusting the Ru content in the NiFeRu layer 16b. When the saturation magnetization of the NiFeRu layer 16b is adjusted to zero by controlling the Ru content, only the thickness of the NiFe layer 16a affects the saturation magnetization of the free layer. As a result, an increase in coercive force of the free layer can be regulated.

Since the magnetic moment of the free layer of the TMR element 1 can be controlled by adjusting the Ru content, the saturation magnetization of the NiFeRu layer 16b can be adjusted to a predetermined value so as to produce a predetermined coercive force in the free layer. Thus, the power consumption of the TMR element 1 can be controlled without changing the thickness of the free layer. Moreover, the NiFe layer 16a can be made as one continuous layer due to the presence of the NiFeRu layer 16b, thereby overcoming the problem encountered in related art.

Although Ru is added to NiFe in the above embodiments, the additive component is not limited to Ru. Examples of additive components are materials containing at least one of tantalum, aluminum, copper, chromium, vanadium, tungsten, niobium, titanium, silicon, rhodium, molybdenum, and manganese. The same advantages can be obtained by using these materials.

Although NiFe is used as the primary component of the free layer, the primary component of the free layer is not limited to NiFe. Examples of the primary component include ferromagnetic materials that exhibit high MR effects, such as a cobalt-iron (CoFe) material or a nickel-iron-cobalt (NiFeCo) material.

Preferably, a layer having a high spin polarization composed of a highly magnetoresistive material is in contact with the intermediate layer such as the Al—Ox layer 15 since the portion in contact with the intermediate layer significantly affects the MR characteristics of the TMR element 1. With such a structure, a TMR element having excellent MR characteristics can be obtained.

The free layer may be constituted from three or more layers as long as at least one of layers is composed of a ferromagnetic material such as NiFe and at least one of other layers is composed of a material having a low saturation magnetization, such as NiFeRu.

Moreover, although the present invention is described in terms of the TMR element as above, the magnetoresistive element incorporating the present invention can be of a giant magnetoresistive (GMR) type in which the nonmagnetic layer between the free layer and the pinned layer is composed of copper or the like.

What is claimed is:

1. A magnetoresistive element comprising:
   a free layer having rotatable magnetization, in which information is recorded in the magnetoresistive element by the rotation of the magnetization of the free layer, the free layer comprising:
   a first ferromagnetic sublayer comprising a ferromagnetic material; and
   a second non-oxide sublayer in direct contact with said first ferromagnetic layer and having a lower saturation magnetization than that of said first ferromagnetic sublayer,
   wherein,
   said second sublayer contains a primary component and an additive component comprising an element different from those of said primary component, and
   said primary component comprises a nickel-iron alloy and the additive component comprises at least one of ruthenium, tantalum, aluminum, copper, chromium, vanadium, tungsten, niobium, titanium, silicon, rhodium, and manganese.

2. The magnetoresistive element according to claim 1, wherein said saturation magnetization of said second sublayer is zero.

3. The magnetoresistive element according to claim 1, wherein said second sublayer has a predetermined saturation magnetization.

4. The magnetoresistive element according to claim 1, further comprising a nonmagnetic intermediate layer in contact with one of the sublayers of the free layer, wherein said one of the sublayers comprises a highly magnetoresistive material and produces the highest magnetoresistive effect among the sublayers constituting the free layer.

5. The magnetoresistive element according to claim 4, wherein the highly magnetoresistive material comprises one of a nickel-iron material, a cobalt-iron material, and a nickel-iron-cobalt material.

6. A magnetic memory device comprising a magnetoresistive element comprising:
   a free layer having a rotatable magnetization in which information is recorded in the magnetoresistive element by the rotation of the magnetization of the free layer, the free layer comprising:
   a first ferromagnetic sublayer comprising a ferromagnetic material; and
   a second non-oxide sublayer in direct contact with said first ferromagnetic layer and having a lower saturation magnetization than that of said first ferromagnetic sublayer,
   wherein
   said second sublayer contains a primary component and an additive component comprising an element different from those of said primary component, and
   said primary component comprises a nickel-iron alloy and the additive component comprises at least one of ruthenium, tantalum, aluminum, copper, chromium, vanadium, tungsten, niobium, titanium, silicon, rhodium, and manganese.

* * * * *